US009620381B2

(12) United States Patent
Patil et al.

(10) Patent No.: US 9,620,381 B2
(45) Date of Patent: Apr. 11, 2017

(54) FACILITATING ETCH PROCESSING OF A THIN FILM VIA PARTIAL IMPLANTATION THEREOF

(71) Applicant: GLOBALFOUNDRIES Inc., Grand Cayman (KY)

(72) Inventors: Suraj K. Patil, Ballston Lake, NY (US); Huy Cao, Rexford, NY (US); Hui Zhan, Clifton Park, NY (US); Huang Liu, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/050,472

(22) Filed: Oct. 10, 2013

(65) Prior Publication Data

US 2015/0104948 A1  Apr. 16, 2015

(51) Int. Cl.
  *H01L 21/311* (2006.01)
  *H01L 29/66* (2006.01)
  *H01L 21/3115* (2006.01)

(52) U.S. Cl.
  CPC .. *H01L 21/31105* (2013.01); *H01L 21/31116* (2013.01); *H01L 29/66795* (2013.01); *H01L 21/31155* (2013.01)

(58) Field of Classification Search
  CPC ..... H01J 2237/31701; H01J 2237/0812; H01J 2237/316; H01J 2237/3165; H01J 2237/3151; H01J 2237/3171; H01J 2237/3174; H01J 2237/3343; H01J 27/026; H01J 37/317; H01J 37/3171; H01L 21/31116; H01L 21/31105; H01L 29/66795; H01L 21/31155

USPC ...... 216/58, 62, 67; 438/285, 514, 515, 518, 438/519, 689, 705, 706, 735
  See application file for complete search history.

(56) References Cited

U.S. PATENT DOCUMENTS

| | | | | |
|---|---|---|---|---|
| 7,190,007 | B2* | 3/2007 | Breitwisch et al. | 257/149 |
| 8,048,788 | B2* | 11/2011 | Hautala et al. | 438/514 |
| 8,440,578 | B2* | 5/2013 | Gumpher | 438/766 |
| 8,889,022 | B2* | 11/2014 | Moll | H01L 21/02107 216/37 |
| 2008/0220574 | A1* | 9/2008 | Jeng | H01L 21/26506 438/231 |
| 2011/0174770 | A1* | 7/2011 | Hautala | 216/13 |
| 2013/0273737 | A1* | 10/2013 | Alptekin et al. | 438/664 |

(Continued)

*Primary Examiner* — Anita Alanko
*Assistant Examiner* — Christopher Remavege
(74) *Attorney, Agent, or Firm* — Heslin Rothenberg Farley & Mesiti P.C.

(57) ABSTRACT

Methods of facilitating fabrication of circuit structures are provided which include, for instance: providing a structure with a film layer; modifying an etch property of the film layer by implanting at least one species of element or molecule into the upper portion of the film layer, the etch property of the film layer remaining unmodified beneath the upper portion; and subjecting the structure and film layer with the modified etch property to an etching process, the modified etch property of the film layer facilitating the etching process. Modifying the etch property of the upper portion of the film layer may include making the upper portion of the film layer preferentially susceptible or preferentially resistant to the etching process depending on the circuit fabrication approach being facilitated.

20 Claims, 9 Drawing Sheets

(56) References Cited

U.S. PATENT DOCUMENTS

| | | | |
|---|---|---|---|
| 2014/0054658 A1* | 2/2014 | Ma | H01L 21/26506 257/288 |
| 2015/0024578 A1* | 1/2015 | von Kluge | H01L 21/306 438/514 |

* cited by examiner

FACILITATING ETCH PROCESSING OF A THIN FILM VIA PARTIAL IMPLANTATION THEREOF

FIELD OF THE INVENTION

The present invention generally relates to methods of facilitating fabrication of circuit structures, and more particularly, to methods of selectively modifying etch properties of thin films to facilitate fabrication of circuit structures using, in part, one or more etching processes.

BACKGROUND

As is known, circuit structure fabrication, such as semiconductor device fabrication, typically involves a process of transferring a mask pattern to a wafer with subsequent etching to remove unwanted material, for instance, to facilitate forming the circuit structures; such as, to facilitate fabricating fin structures and/or gate structures of fin-type field-effect transistors (FinFETs), or to facilitate forming field-effect transistors (FETs) in general, etc. This process is generally referred to as lithographic processing. As the size of technology nodes continues to decrease, significant challenges may arise due, in part, to limitations of available lithographic processing techniques, including issues related to achieving one or more target critical dimensions.

SUMMARY OF THE INVENTION

The shortcomings of the prior art are overcome and additional advantages are provided through the provision, in one aspect, of a method for facilitating fabrication of a circuit structure. The method includes, for instance: providing a circuit structure having a film layer thereover, the film layer being non-metal and disposed over planar and non-planar areas of the circuit structure, the film layer having a non-amorphous crystalline lattice structure; modifying an etch property of an upper portion of an entirety of the film layer, the modifying including implanting at least one species of element or molecule into the upper portion of the film layer, the etch property of the film layer remaining unmodified beneath the upper portion thereof; and the modifying further includes controlling the implanting to prevent amorphization of the non-amorphous crystalline lattice structure of the film layer, including the upper portion thereof. The method further includes subjecting the structure including the film layer with the modified etch property to at least one etching process, the modified etch property of the film layer facilitates fabrication of the circuit structure using, in part, the etching process, and the modified etch property of the upper portion of the film layer prevents removal of a lower portion of the film layer by the at least one etching process.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
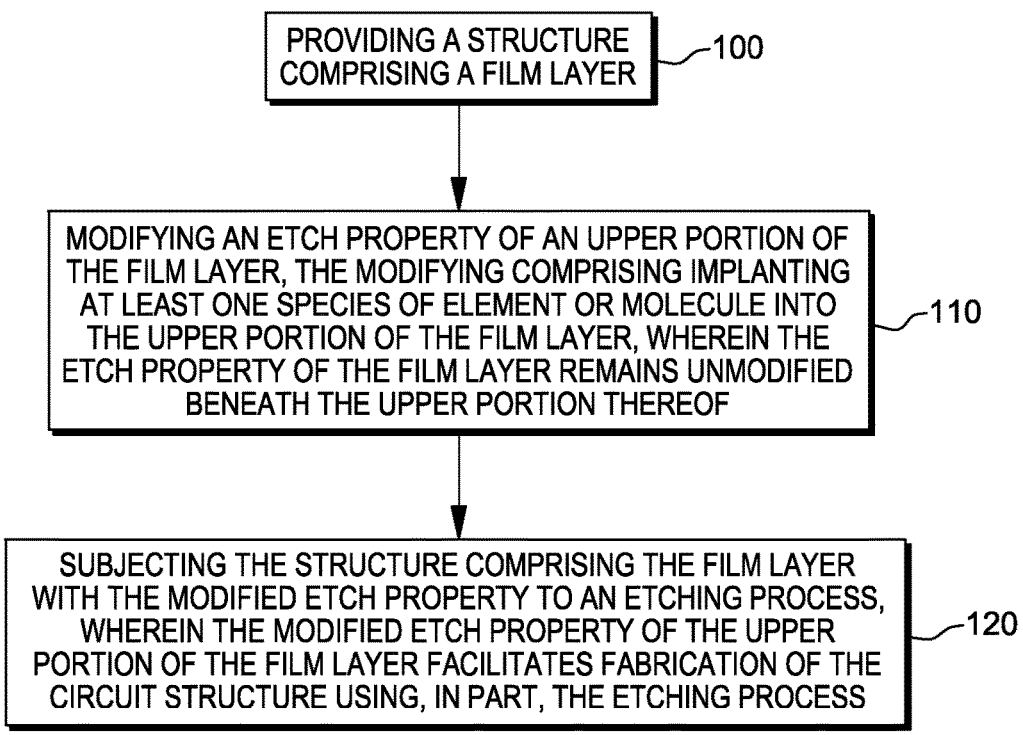
FIG. 1 outlines a process for facilitating fabricating a circuit structure, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Generally stated, provided herein, in one aspect, is a method for facilitating fabricating a circuit structure. The facilitating fabricating includes, for instance: providing a structure including a film layer; modifying an etch property of the film layer, the modifying including implanting at least one species of element or molecule into an upper portion of the film layer, the etch property of the film layer remaining unmodified beneath the upper portion; and subjecting the structure including the film layer with the modified etch property to an etching process, wherein the modified etch property of the film layer facilitates fabrication of the circuit structure using, in part, the etching process. In one or more embodiments, the implanting of at least one species of element of molecule into an upper portion of the film layer may include pre-amorphization ion (PAI) implantation of one or more species of elements into the upper portion of the film layer. In one or more other embodiments, the implanting may include gas-cluster ion beam (GCIB) implantation of one or more types of molecules into the upper portion of the film layer.

In one or more embodiments, the facilitating fabricating a circuit structure may further include achieving a desired critical dimension for the circuit structure. Many methods for the fabrication of circuit structures from or over a substrate material employ photolithography and related processes, which may result in an intermediate circuit structure with a film layer created or deposited over a substrate structure. Due to certain inherent limitations of such fabrication methods, regions of the circuit structure may be under-etched or over-etched, possibly resulting in errors in one or more critical dimensions of the circuit structure. For instance, issues may arise with spacing between two circuit components, the width or height of a component, etc. Achieving correct critical dimensions using traditional fabrication methods has become more difficult as these critical dimensions continue to shrink. The needed corrections to a critical dimension are typically on the order of a few nanometers or less, possibly even less than one nanometer, a fine correction size that most traditional methods cannot achieve. The methods disclosed herein overcome these limitations of the art and provide, in one aspect, a process for achieving precise correction to one or more critical dimensions in a circuit structure.

In one or more embodiments, the facilitating fabricating a circuit structure may further include protecting underlying regions or structures of the circuit structure from an etch process by making an upper portion of a film layer resistant to the etching process. Many methods for the fabrication of circuit structures include processing steps that require adding a hard-mask or sacrificial layer of material over some regions of a circuit structure to protect those regions from a subsequent etching process, for example, to protect fin structures from erosion damage during an etch process. Generally the added layer must be removed in a subsequent etch processing step, in which the etch process is chosen to lift off the sacrificial or hard-mask layer without damaging the underlying structure. Although such techniques are widely used, they are not without drawbacks and added costs, which will continue to increase as the size of circuit structures continues to decrease. The methods disclosed herein overcome these limitations of the art and provide, in one aspect, a process for modifying the etch properties of a portion of an existing film layer to, for instance, make the film layer resistant against an etch process.

Thus, in one embodiment, the facilitating fabricating a circuit structure may make the upper portion of a film layer more susceptible to an etching process, for instance, to facilitate etching away the modified upper portion to reduce the thickness of the film layer. In one or more such implementations, an etch property of the upper portion may be modified via pre-amorphization ion implantation of one or more species of elements that make the film layer susceptible to the subsequent etch process. In one or more other implementations, an etch property of the upper portion may be modified via gas-cluster ion beam implantation of one or more species of molecules that make the film layer susceptible to the etch process. In any of these implementations, the etching process may be any process that will preferentially remove the material of the modified upper portion without removing the material of the unmodified portion of the film layer beneath the upper portion. The etching process may further be controlled to reduce the thickness of the upper portion of the film layer, for instance, to achieve a desired critical dimension of the film layer.

In another embodiment, the method facilitates fabrication of a circuit structure, for example, by making the upper portion of a film layer resistant to an etching process, and subsequently subjecting the film layer to an etching process against which the upper portion of the film layer is resistant. In one or more such implementations, an etch property of the upper portion of the film layer may be modified via pre-amorphization ion implantation of one or more species of elements that make the film layer resistant to the etch process. In one or more other implementations, an etch property of an upper portion of a film layer may be modified via gas-cluster ion beam implantation of one or more species of molecules that make the film layer resistant to an etch process. In any of these implementations, the etching process may be any process to which the modified upper portion of the film layer is resistant, thereby providing protection of the underlying film layer and structures. In one or more implementations, modifying the upper portion of the film layer may alter the thickness of the film layer, and therefore be used to, for instance, achieve a desired critical dimension of the film layer. In one or more other implementations, the modified upper portion of the film layer may be subjected to a second etching process that preferentially etches away the modified upper portion of the film layer, and this may alternatively be used to, for instance, achieve a desired critical dimension of the film layer.

In yet other embodiments, the facilitating fabricating a circuit structure includes modifying an etch property of an upper portion of a film layer via a first implantation of a first species of element or molecule, subjecting the structure to a first etching process, further modifying the modified etch property of the upper portion of the film layer via a second implantation of a second species of element or molecule, and further subjecting the structure to a second etching process. In one or more embodiments, the first implantation of the first species of element or molecule may, for instance, make the upper portion of the film layer resistant to the first etching process, and the second implantation of the second species of element or molecule may, for instance, make the upper portion of the film layer preferentially susceptible to the second etching process. In the one or more implementations, in which the second implantation makes the upper portion of the film layer susceptible to the second etching process, the second etching process may, by way of example, be controlled to reduce the thickness of the upper portion of the film layer, and therefore may be used to, for instance, achieve a desired critical dimension of the film layer. In one or more other implementations, the first implantation of the first species of element or molecule may, for example, make the upper portion of the film layer susceptible to a first etching process, and the second implantation of the second species of element or molecule may make the upper portion of the film layer resistant to the second etching process.

Reference is made below to the drawings, which are not drawn to scale for ease of understanding, wherein the same reference numbers used throughout different figures designate the same or similar components.

By way of summary, FIG. 1 illustrates one embodiment of a process for facilitating fabricating a circuit structure, in accordance with one or more aspects of the present invention. In the embodiment illustrated, the process includes, for example: providing a structure that has a film layer 100; modifying an etch property of the film layer, including implanting at least one species of element or molecule into the upper portion of the film layer, the etch property of the film layer remaining unmodified beneath the upper portion 110; and subjecting the structure and film layer with the modified etch property to an etching process, wherein the modified etch property of the film layer facilitates fabrication of the circuit structure using, in part, the etching process 120.

FIGS. 2A-2D depict one embodiment of processing in accordance with one or more aspects of the present invention. In this process, a structure with a film layer undergoes modification of an etch property of an upper portion of the film layer to, for instance, make the upper portion susceptible to a subsequent etching process. Such a process may be used, for instance, to facilitate providing a final film layer of reduced thickness. By way of example, the film layer may be processed to achieve a desired critical thickness dimension for the film layer.

Figure 2A:
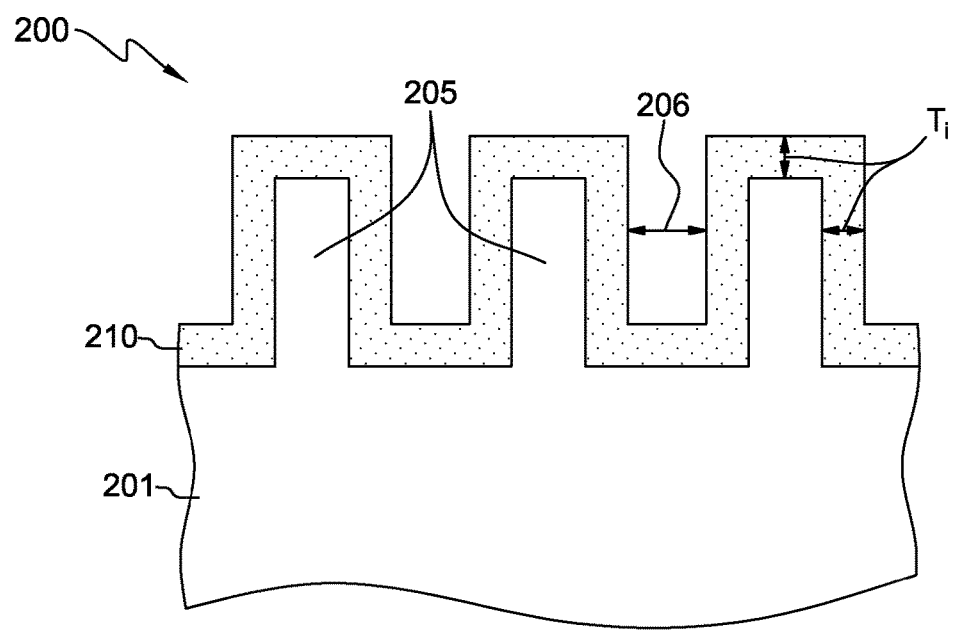
FIGS. 2A-2D depict one embodiment of a process for facilitating fabricating a circuit structure, wherein an etch property of an upper portion of a film layer is modified by implantation of at least one species of element or molecule, and the modified etch property makes the upper portion of the film layer susceptible to an etching process, in accordance with one or more aspects of the present invention.

FIG. 2A depicts a structure 200, including a substrate structure 201 with a film layer 210, obtained during fabrication of a circuit structure in accordance with one or more aspects of the present invention. In one embodiment, substrate structure 201 may be fabricated of or include a polysilicon material, and film layer 210 may be fabricated of a dielectric material, such as silicon nitride. These particular substrate and film layer materials are provided by way of example only. Other types of substrate and film layer materials may also, or alternatively, be provided. The structure in this embodiment is further depicted as having a plurality of regions 205, such as fins, components, gates, contacts, etc., that are substantially non-planar with underlying substrate 201, with a spacing 206 between the components and film layer illustrated. The initial thickness $T_i$ of the film layer 210 is shown in this figure (by way of example) as being uniform over the portion of the structure and regions depicted, though it is to be understood that the disclosed method may apply in cases where the film layer thickness is not uniform. For example, where regions 205 have surfaces that are substantially perpendicular to substrate 201 and surfaces that are substantially parallel to substrate 201, the film layer may have different thicknesses over the substantially parallel surfaces versus the substantially perpendicular surfaces.

Figure 2B:
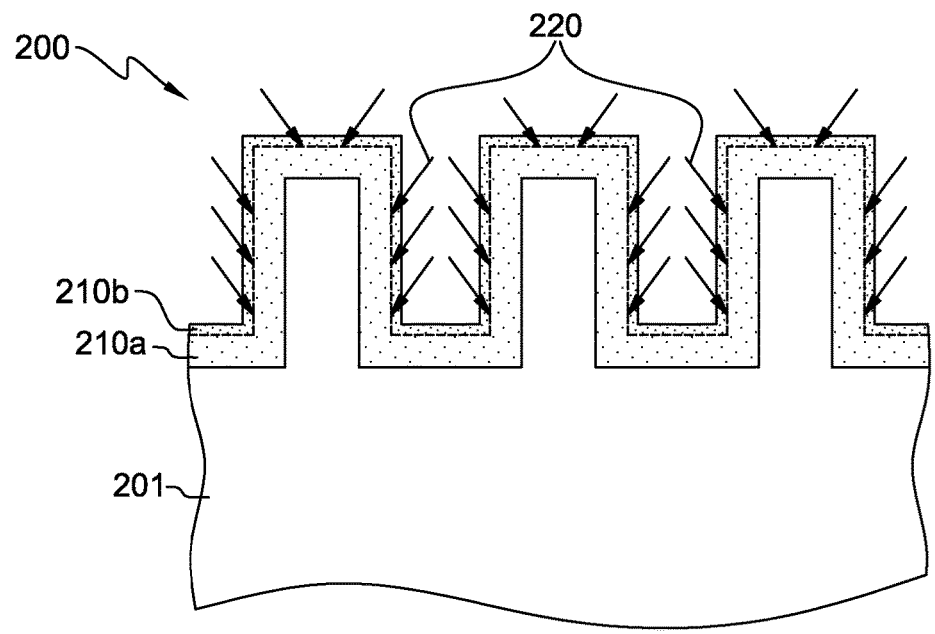

FIG. 2B depicts the structure 200 of FIG. 2A undergoing implantation 220 of at least one species of element or molecule into an upper portion 210b of the film layer to modify an etch property of that upper portion, such that, for example, the upper portion 210b will be susceptible to an etching process, while the portion 210a beneath upper portion 210b remains unmodified. In this embodiment, the modification may be accomplished, for instance, by pre-amorphization ion implantation of at least one species of element or, for instance, by gas-cluster ion beaming of at least one type of molecule. The at least one element or molecule chosen for implantation will depend on the specific etching process to be used. By way of example, elements that typically make dielectric film layers susceptible to commonly used etch processes include, but are not limited to, oxygen, germanium, boron, phosphorous, and arsenic. Oxygen or boron, for example, will make a dielectric film layer, such as silicon nitride, susceptible to an etching process, such as a SICONI® cleaning (SICONI® is a registered trademark of Applied Materials, Inc., of Santa Clara, Calif.) that preferentially removes the oxide-rich upper portion 210b of the film layer without affecting the unmodified portion beneath. Similarly by way of example, molecules that may be implanted by gas-cluster ion beaming that tend to make dielectric film layers susceptible to etch processing include, but are not limited to, $O_2$, $SiH_4+O_2$, $SiH_4+NH_3$, $B_2H_6$, $PH_3$, $SiH_4+B_2H_6$, $SiH_4+PH_3$, $SiH_4+He$, and silicon. By way of example, the modified upper portion of the film layer following implantation may then include, for instance, silicon oxide ($SiO_x$), silicon oxynitride ($Si-O_xN_y$), hydrogenated silicon nitride ($SiN_x$:H), or another material that is susceptible to an etching process that preferentially removes the upper portion 210b of the film layer without affecting the unmodified portion 210a beneath. By way of example, the etching process may be a SICONI® cleaning process, which will remove such materials as silicon oxide, silicon oxynitride, hydrogenated silicon nitride, or other materials, without affecting the unmodified portion 210a of the film layer.

Pre-amorphization ion (PAI) implantation of a single element species typically requires implanting ions into the target structure at low energies, for instance, between about 1 keV and 15 keV, to achieve implantation of the chosen species without destroying, or amorphizing, the lattice structure of the target. At such energies, ion implantation will generally penetrate about one to two nanometers past the outer surface into the film layer before stopping, the exact level of penetration is dependent on the element species chosen, the energy of implantation, and the angle at which the ions are implanted relative to the surface of the target structure, etc. PAI implantation of a single species element may be combined with an annealing of the modified film layer, for example, to activate one or more dopant materials in the modified film layer, or PAI implantation may be completed without annealing. Whether or not annealing is combined with implantation will depend, in part, on the subsequent processes for completing fabrication of the circuit structure. Similarly, gas-cluster ion beaming (GCIB) of molecules into a target is capable of achieving shallow implantation of those molecules into the target structure. Using this process, penetration into the target structure may be, for instance, between about 2 nanometers and 20 nanometers, depending on the type of molecular clusters chosen, the energy of the cluster beam, the material composition of the target, and the angle at which the molecules are implanted relative to the surface of the target structure. GCIB processes typically are controlled so as to effect changes to the desired thickness within the target structure without causing damage to the lattice structure of the target.

The relative thickness proportions of the modified upper region 210b and unmodified portion 210a beneath, as illustrated in FIG. 2B, are shown here by way of example only. Although either PAI or GCIB implantation may allow for modifying about 50% or more of the film layer thickness without damaging the lattice structure of the film layer, depending on the implantation parameters described above, the amount of the film layer requiring modification may be much less, for example about 10% of the film layer thickness, and may even be about 1-5% of the film layer thickness, or less.

Figure 2C:
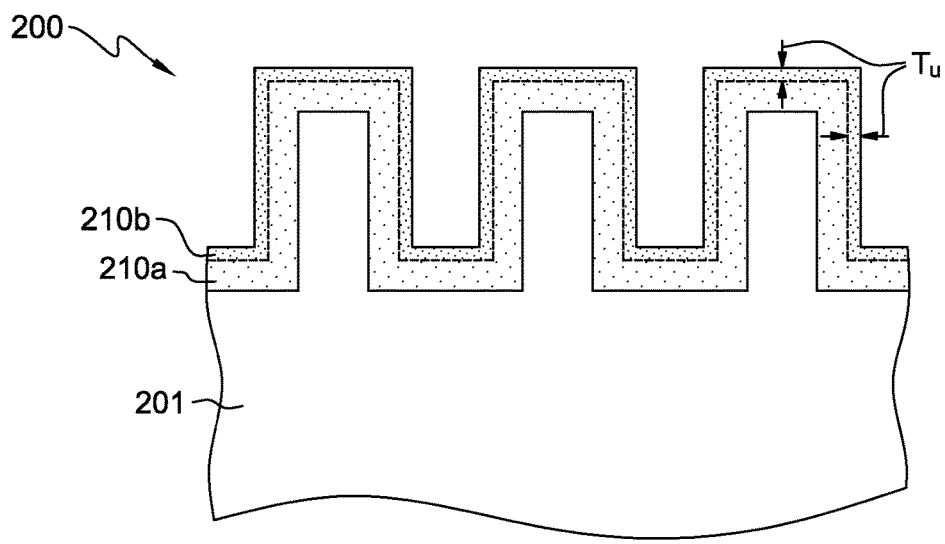

FIG. 2C depicts structure 200 after implantation is completed and prior to subjecting structure 200 to an etching process. In this example, the film layer now has an upper portion 210b with a modified etch property and a portion 210a beneath upper portion 210b that remains unmodified. The thickness $T_u$ of modified upper portion 210b may, for instance, be uniform, as depicted here for illustrative purposes; alternatively the thickness $T_u$ may vary between regions of structure 200. The implanting of at least one species of element or molecule into a dielectric film layer, either by PAI or GCIB, may alter the film layer's molecular structure in the region of the implant, and may result in an increase in the thickness of the film layer. For example, this increase may occur within the upper portion 210b of the film layer that undergoes modification of the etch property, affecting the thickness $T_u$ of the upper portion. The exact increase in thickness $T_u$ will depend on the type of film layer, the at least one species of element or molecule implanted into the upper portion of the film layer, the energy of implantation, and the angle of implantation, etc. This increased thickness $T_u$ may need to be accounted for during one or more subsequent etching processes to etch away a correct amount of the upper portion of the film layer to achieve a desired critical thickness for the film layer.

In this example, the structure 200 is subsequently subjected to an etching process that preferentially removes the modified upper portion of the film layer. For example, in embodiments where the upper portion has been made oxide rich through, for instance, PAI implantation of oxygen, the etching process may be, for example, a SICONI® cleaning process that preferentially removes oxide materials. In one embodiment the etching process may be controlled to reduce the thickness $T_u$ of the upper portion 210b of the film layer. In another embodiment, the etching process may be a first etching process that reduces thickness $T_u$ by a fractional amount, and the structure 200 may be subjected to a second etching process to reduce thickness $T_u$ by an another fractional amount.

Figure 2D:
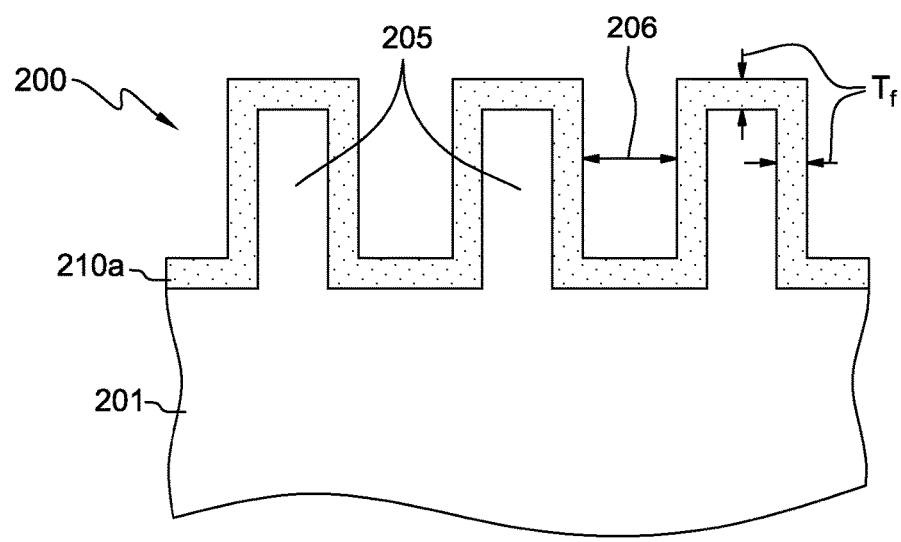

FIG. 2D depicts the structure 200 of FIG. 2C after the etching process has removed the upper portion of the film layer. The unmodified portion 210a of the film layer remains with final reduced thickness $T_f$. In the example embodiment depicted in FIG. 2D, the etching process has removed the entire upper portion of the film layer, leaving only that portion 210a of the film layer that remained unmodified by the implantation process. It is to be understood, however, that the etching process may reduce the thickness of the upper portion of the film layer without entirely removing it. The final thickness $T_f$ of resulting film layer 210a is shown in this figure, by way of example, as being uniform, though it is to be understood that thickness $T_f$ may also be non-uniform, if desired. In any one or more of the above embodiments, the reduction of the upper portion of the film layer may be used to achieve one or more target critical dimensions for the film layer. The critical dimensions may be, for instance, the reduced thickness $T_f$ of the film layer, the spacing 206 between non-planar regions 205 of structure 200, or a different critical dimension of structure 200.

Figure 3A:
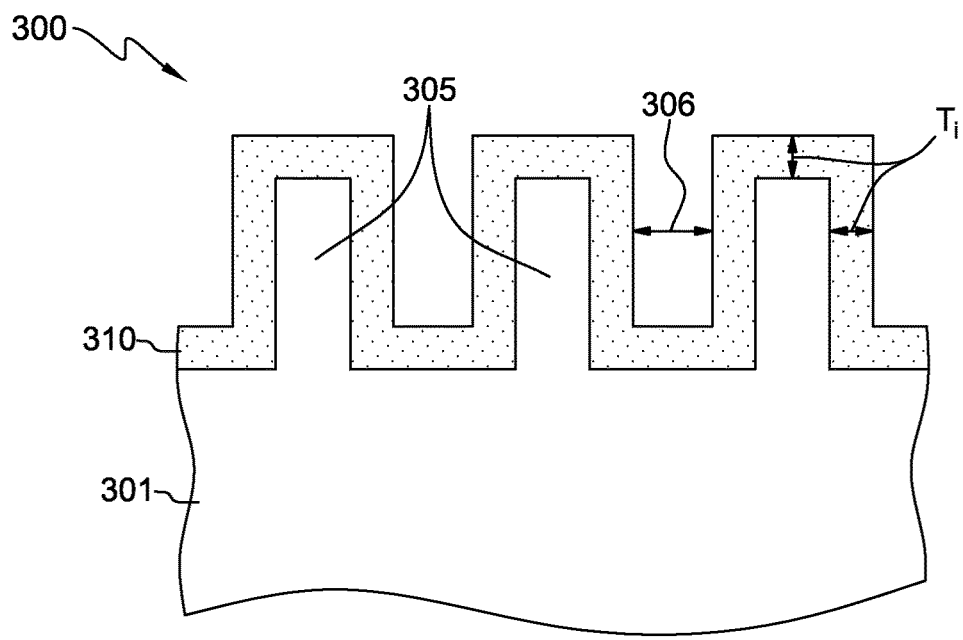
FIGS. 3A-3D depict another embodiment of a process for facilitating fabricating a circuit structure, wherein an etch property of an upper portion of a film layer is modified by implantation of at least one species of element or molecule, and the modified etch property makes the upper portion of the film layer resistant to an etching process, in accordance with one or more aspects of the present invention.
Figure 3B:
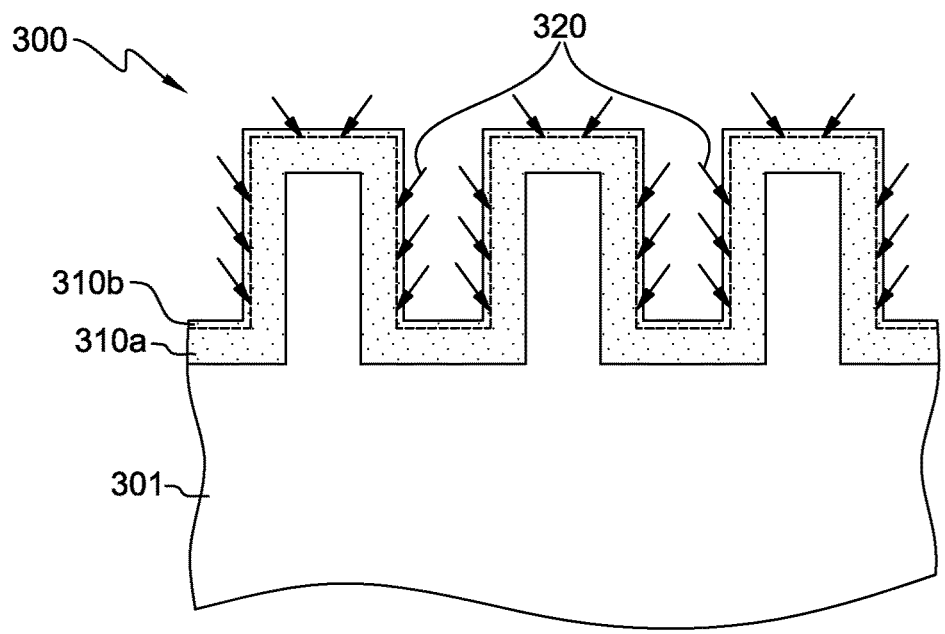
Figure 3C:
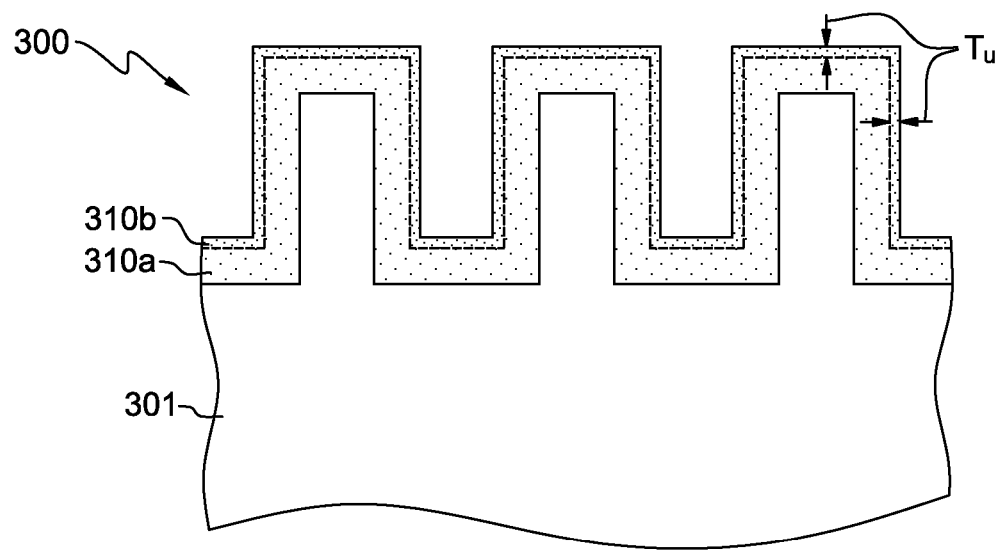
Figure 3D:
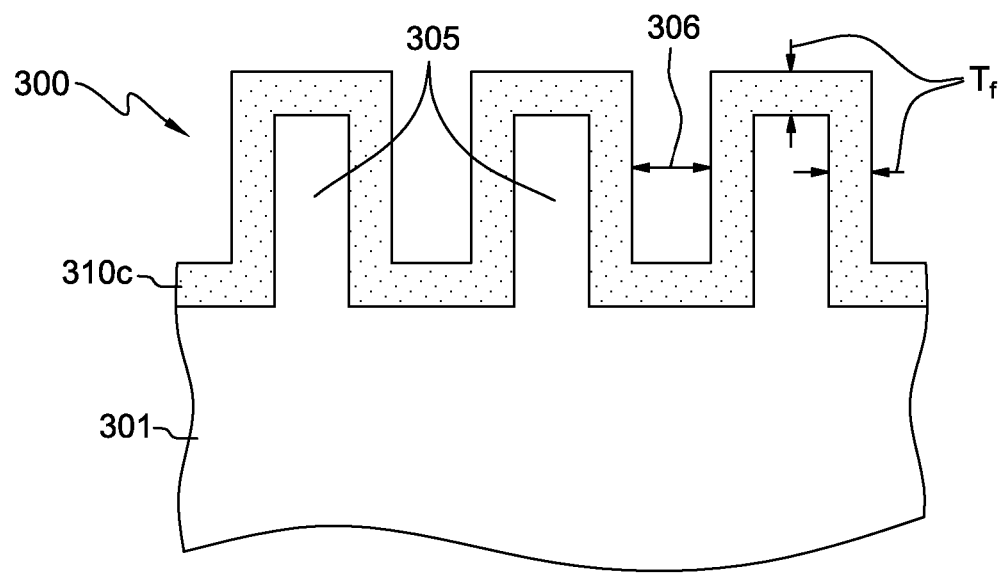
Figure 3E:
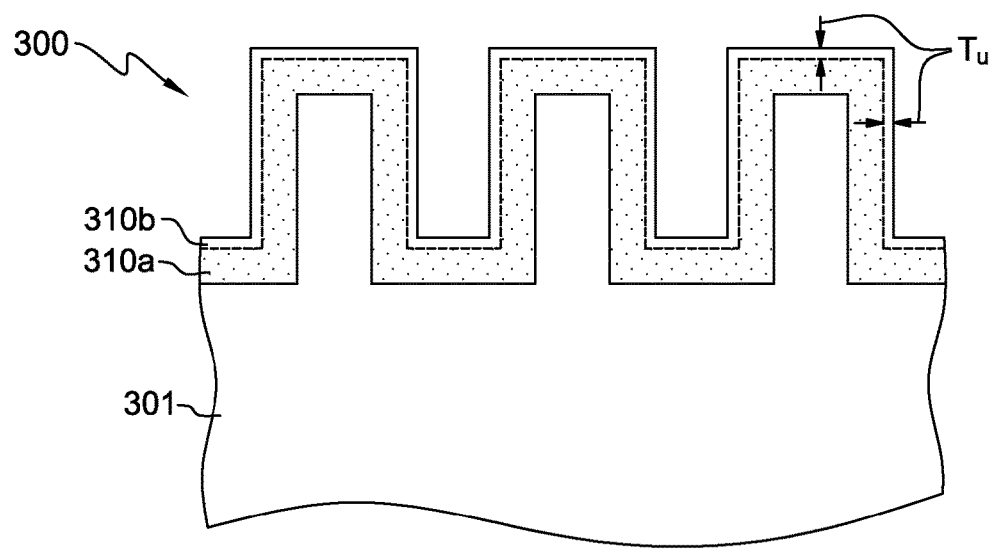
FIGS. 3E-3F depict an alternative embodiment of the process depicted in FIGS. 3A-3D, which includes both a first etching process, in which the upper portion with the modified etch property is resistant to the first etching process, and a second etching process, in which the upper portion with the modified etch property is susceptible to the second etching process, in accordance with one or more aspects of the present invention.
Figure 3F:
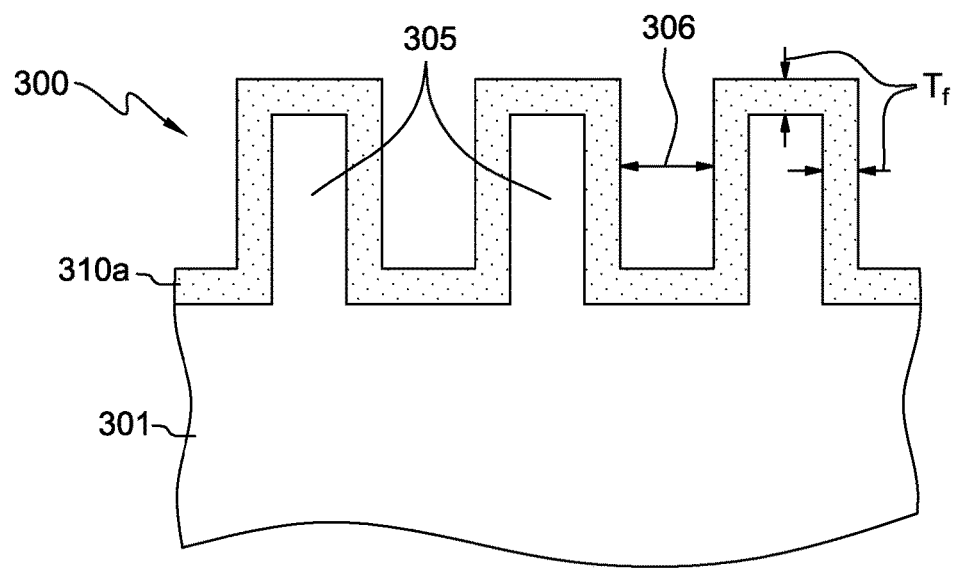

FIGS. 3A-3F depict further embodiments of processing in accordance with one or more aspects of the present invention. In particular, FIGS. 3A-3D depict one process embodiment in which a structure with a film layer undergoes modification of an etch property of an upper portion of the film layer, and the modification makes the upper portion resistant to a subsequent etching process. By way of example, the modified upper portion of the film layer may also achieve a desired critical thickness dimension for the film layer. FIGS. 3E-3F depict an alternate process embodiment in which the structure (of FIG. 3C) is subjected to a second etching process, which then removes the upper portion of the film layer. By way of example, the modified upper portion of the film layer may also achieve a desired critical thickness dimension for the film layer.

FIG. 3A depicts a structure 300, similar to the structure of FIG. 2A, including a substrate structure 301 with a film layer 310, obtained during fabrication of a circuit structure in accordance with one or more aspects of the present invention. In one embodiment, substrate structure 301 may be fabricated of or include a polysilicon material and film layer 310 may be fabricated of a dielectric material, such as silicon nitride. These particular substrate and film layer materials are provided by way of example only. Other types of substrate and film layer materials may also, or alternatively, be provided. The structure in this embodiment is further depicted as having a plurality of regions 305, such as fins, components, gates, contacts, etc., that are substantially non-planar with underlying substrate 301 with a spacing 306 between the components and film layer illustrated. The initial thickness T, of film layer 310 is shown in this figure (by way of example) as being uniform over the portion of the structure and regions depicted, though it is to be understood that the disclosed method may apply in cases where the film layer thickness is not uniform. For example, where regions 305 have surfaces that are substantially perpendicular to substrate 301 and surfaces that are substantially parallel to substrate 301, the film layer may have different thicknesses over the substantially parallel surfaces versus the substantially perpendicular surfaces.

FIG. 3B depicts the structure 300 of FIG. 3A undergoing implantation 320 of at least one single species element or molecule of the upper portion 310b of the film layer to modify an etch property of that upper portion, such that, for example, the upper portion 310b will be resistant to an etching process, while the portion 310a beneath the upper portion 310b remains unmodified. In this embodiment, the modification may be accomplished, for instance, by pre-amorphization ion implantation of at least one species of element or, for instance, by gas-cluster ion beaming of at least one type of molecule.

The at least one element or molecule chosen for implantation will depend on the specific etching process to be used. By way of example, elements that typically make dielectric film layers resistant to commonly used etch processing include, but are not limited to, carbon, nitrogen, xenon, argon, or amorphous silicon (a-Si). Similarly, by way of example, molecules that may be implanted by gas-cluster ion beaming that tend to make dielectric film layers resistant to etch processing include, but are not limited to, argon, xenon, krypton, silicon, $SiH_4+CH_4$, $SiH_4+CHF_3$, $SiH_4+N_2+CH_4$, and $SiH_4+NH_3$. By way of example, the modified upper portion of the film layer following implantation may then include, for instance, SiC (silicon carbide), $SiCN_x$ (silicon carbonitride), or SiOC (silicon oxycarbide), or another material that is resistant to an etching process. For example, silicon carbide, silicon carbonitride, and silicon oxycarbide carbon are each resistant to, for instance, a SICONI® cleaning process.

FIG. 3C depicts the structure 300 of FIG. 3B after implantation has been completed and prior to subjecting structure 300 to an etching process. In this example, the film layer now has an upper portion 310b with a modified etch property and a portion 310a beneath upper portion 310b that remains unmodified. The thickness $T_u$ of modified upper portion 310b may, for instance, be uniform, as depicted here for illustrative purposes; alternatively the thickness $T_u$ may vary between some regions of structure 300. The implanting of at least one species of element or molecule into a dielectric film layer, either by PAI or GCIB, may alter the film layer's molecular structure in the region of the implant, and may result in an increase in the thickness of the film layer. For example, this increase may occur within the upper portion 310b of the film layer that undergoes modification of the etch property, affecting the thickness $T_u$ of the upper portion. The exact increase in thickness $T_u$ will depend on the type of film layer, the at least one species of element or molecule implanted into the upper portion of the film layer, the energy of implantation, and the angle of implantation, etc.

FIG. 3D depicts one possible embodiment of this aspect of the present invention. In this embodiment, structure 300 is subjected to an etching process to which the modified upper portion (not separately labeled in this figure) of the film layer is resistant, and the modified upper portion is not subsequently removed. In this embodiment, the resulting film layer 310c remains over the structure 300 and non-planar regions 305. The final thickness $T_f$ of resulting film layer 310c is shown in this figure, by way of example, as being uniform, though it is to be understood that final thickness $T_f$ may also be non-uniform, if desired. In one example of this embodiment, leaving the modified upper portion intact may be used to further protect film layer 310c from additional etching processes. In another example of this embodiment, leaving the modified upper portion intact may be used to achieve one or more target critical dimensions for the film layer. The critical dimensions may be, for instance, the increased final thickness $T_f$ of the film layer, the spacing 306 between non-planar regions 305 of structure 300, or a different critical dimension of structure 300.

FIG. 3E depicts another embodiment of one or more aspects of the present invention. In this embodiment, the etching process is a first etching process to which the modified upper portion 310b of the film layer is resistant, and the structure 300 is then subjected to a second etching process to which the modified upper portion 310b is susceptible, and to which the portion 310a beneath the modified upper portion is resistant. The second etching process may, for example, be a different etching process from the first etching process, or it may be the same or similar etching process conducted, for example, with different reactants, pressures, or other process parameters from the first etching process. As one example of this embodiment, modifying the upper portion of the film layer may include PAI implantation of, for instance, carbon into a silicon nitride film layer to form an upper portion composed of SiCN (silicon carbonitride); the first etching process may be, for example, a SICONI® cleaning process to which silicon carbonitride is resistant, and the second etching process may be, for example, an argon sputtering process that will remove the silicon carbonitride.

FIG. 3F depicts the structure 300 following the first and second etching processes of FIG. 3E. The unmodified portion 310a of the film layer remains with final reduced thickness $T_f$. In the example depicted in FIG. 3F, the second etching process has removed the entire upper portion of the film layer, leaving only that portion 310a of the film layer that remained unmodified by the implantation process. It is to be understood, however, that the second etching process may reduce the thickness of the upper portion of the film layer without entirely removing it. The final thickness $T_f$ of resulting film layer 310a is shown in this figure, by way of example, as being uniform, though it is to be understood that final thickness $T_f$ may also be non-uniform, if desired. In any one or more of the above embodiments, the reduction of the upper portion of the film layer may be used to achieve one or more target critical dimensions for the film layer. The critical dimensions may be, for instance, a reduced final thickness $T_f$ of the film layer, the spacing 306 between non-planar regions 305 of structure 300, or a different critical dimension of structure 300.

FIGS. 4A-4F depict another embodiment of processing in accordance with one or more aspects of the present invention. In this process embodiment, a structure with a film layer undergoes modification of an etch property of an upper portion of the film layer, the structure is then subjected to a first etching process, the modified film layer then undergoes further modification of an etch property of the upper portion of the film layer, and the structure is further subjected to a second etching process. In another embodiment depicted by FIGS. 4A-4F, the modification of the etch property makes the upper portion of the film layer resistant to the first etching process, and the further modification of the etch property makes the upper portion of the film layer susceptible to the second etching process. Such a process may be used, for instance, to first protect some regions of a structure from being damaged during the first etching process, and the further modification is then used to facilitate removal of the resistant upper portion. By way of example, the film layer may be finally processed to achieve one or more desired critical thickness dimensions for the film layer.

Figure 4A:
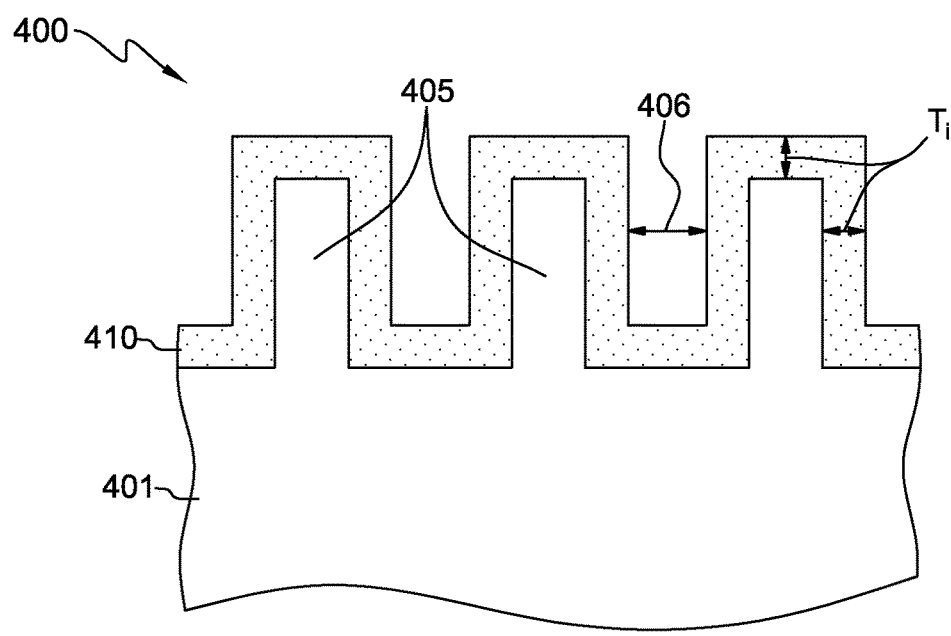
FIGS. 4A-4F depict a further embodiment of a process for facilitating fabricating a circuit structure, wherein an etch property of an upper portion of the film layer is modified via a first implantation of a first species of element or molecule, the structure is subjected to a first etching process, the upper portion of the film layer with the modified etch property is further modified via a second implantation of a second species of element or molecule, and the resultant structure is subjected to a second etching process, in accordance with one or more aspects of the present invention.

FIG. 4A depicts a structure 400, similar to the structures of FIG. 2A and 3A, including a substrate structure 401 with a film layer 410, obtained during fabrication of a circuit structure in accordance with one or more aspects of the present invention. In one embodiment, substrate structure 401 may be fabricated of or include a polysilicon material and film layer 410 may be fabricated of a dielectric material, such as silicon nitride. These particular substrate and film layer materials are provided by way of example only. Other types of substrate and film layer materials may also, or alternatively, be provided. The structure in this embodiment is further depicted as having a plurality of regions 405, such as fins, components, gates, contacts, etc., that are substantially non-planar with underlying substrate 401 with a spacing 406 between the components and film layer illustrated. The initial thickness $T_i$ of film layer 410 is shown in this figure (by way of example) as being uniform over the portion of the structure and regions depicted, though it is to be understood that the disclosed method may apply in cases where the film layer thickness is not uniform. For example, where the regions 405 have surfaces that are substantially perpendicular to substrate 401 and surfaces that are substantially parallel to substrate 401, the film layer may have different thicknesses over the substantially parallel surfaces versus the substantially perpendicular surfaces.

Figure 4B:
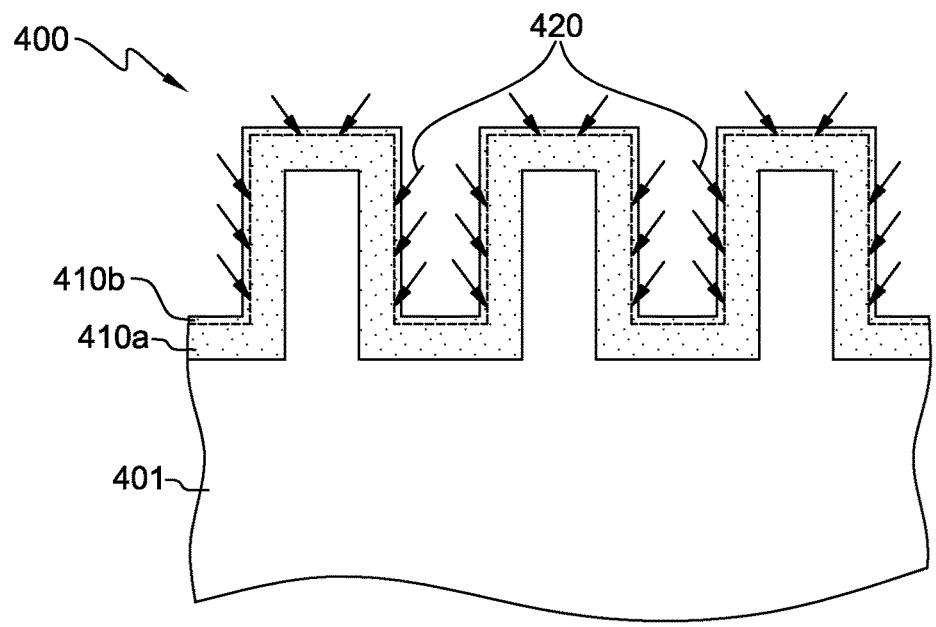

FIG. 4B depicts the structure 400 of FIG. 4A undergoing a first implantation 420 of at least one first species of element or molecule into an upper portion 410b of the film layer to modify an etch property of the upper portion, such that, for example, the upper portion 410b will be resistant to a first etching process, while the portion 410a beneath the upper portion remains unmodified. As described in one or more previous embodiments, the modification may be accomplished either by pre-amorphization ion implantation of at least one species of element or by gas-cluster ion beaming of at least one type of molecule. By way of example, elements that typically make dielectric film layers resistant to commonly used etch processes include, but are not limited to, carbon, nitrogen, xenon, argon, or amorphous silicon (a-Si). Similarly by way of example, molecules that may be implanted by gas-cluster ion beaming that tend to make dielectric film layers resistant to etch processing include, but are not limited to, argon, xenon, krypton, silicon, $SiH_4+CH_4$, $SiH_4+CHF_3$, $SiH_4+N_2+CH_4$, and $SiH_4+NH_3$. By way of example, the modified upper portion of the film layer following implantation may then include, for instance, SiC (silicon carbide), $SiCN_x$ (silicon carbonitride), or SiOC (silicon oxycarbide), or another material that is resistant to an etching process.

Figure 4C:
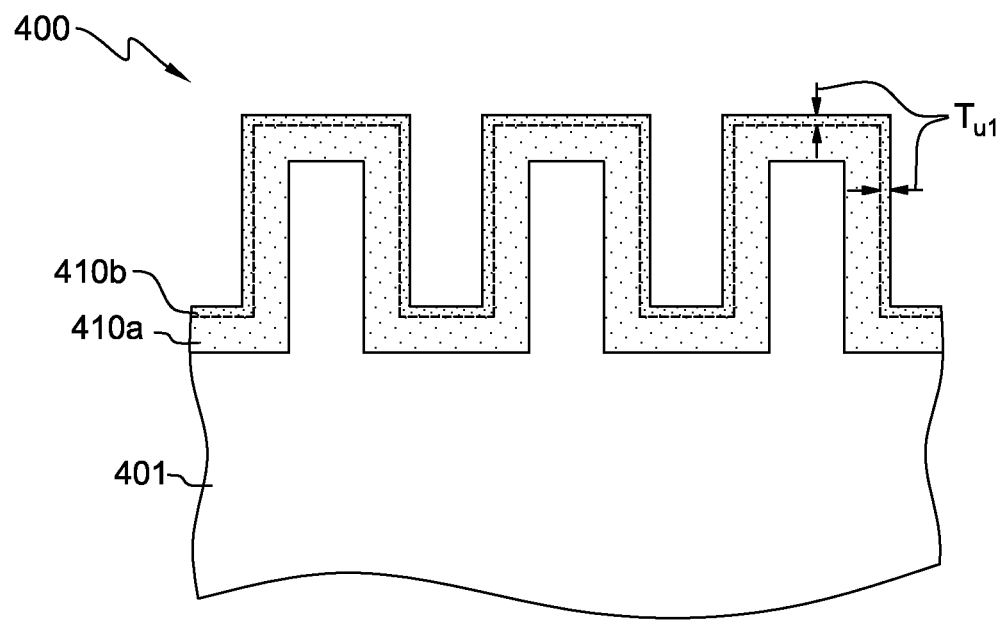

FIG. 4C depicts the structure 400 of FIG. 4B after the first implantation has been completed and after subjecting structure 400 to a first etching process, the film layer now having an upper portion 410b with a modified etch property and a portion 410a beneath upper portion 410b that remains unmodified. The thickness $T_{u1}$ of modified upper portion 410b may, for instance, be uniform, as depicted here for illustrative purposes; alternatively the thickness $T_{u1}$ may vary between regions of the structure 400. As described in previous embodiments, the implanting of a single species element or molecule into a dielectric film layer, either by PAI or GCIB, may alter the film layer's molecular structure and may result in an increase in the thickness of the film layer.

Figure 4D:
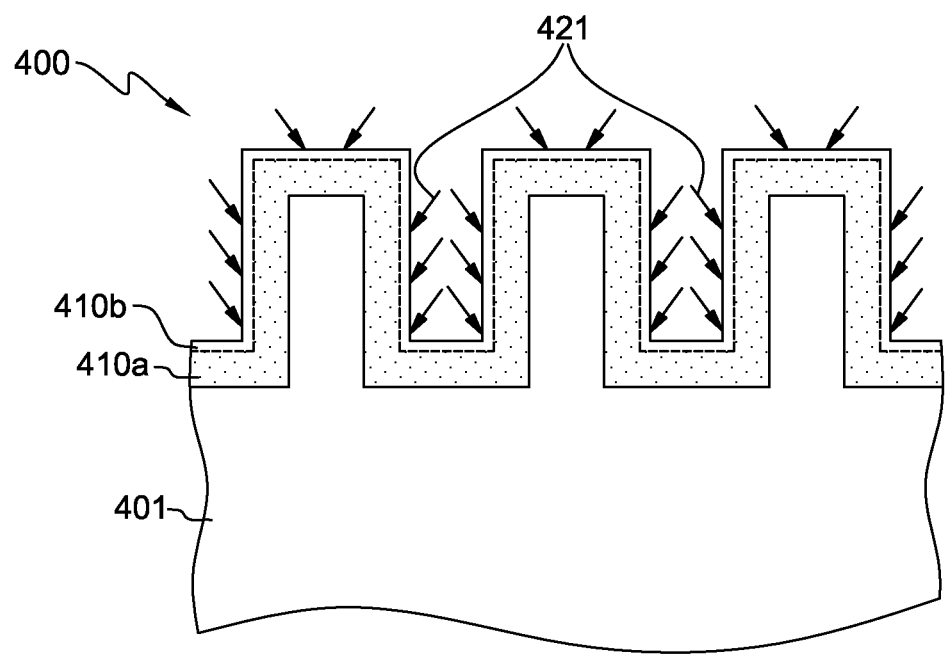

FIG. 4D depicts the structure 400 of FIG. 4C undergoing a second implantation 421 of at least one second species of element or molecule into an upper portion 410b of the film layer to further modify an etch property of the upper portion, such that, for example, the upper portion 410b will be susceptible to a second etching process, while the portion 410a beneath the upper portion remains unmodified. As described in one or more previous embodiments, the modification may be accomplished, for example, by pre-amorphization ion implantation of at least one species of element or, for example, by gas-cluster ion beaming of at least one type of molecule. By way of example, elements that tend to make dielectric film layers susceptible to commonly used etch processes include, but are not limited to, oxygen, germanium, boron, phosphorous, and arsenic. Similarly by way of example, molecules that may be implanted by gas-cluster ion beaming that tend to make dielectric film layers susceptible to etch processing include, but are not limited to, $O_2$, $SiH_4+O_2$, $SiH_4+NH_3$, $B_2H_6$, $PH_3$, $SiH_4+B_2H_6$, $SiH_4+PH_3$, $SiH_4+He$, and silicon. By way of example, the modified upper portion of the film layer following implantation may then include, for instance, silicon oxide ($SiO_x$), silicon oxynitride ($SiO_xN_y$), hydrogenated silicon nitride ($SiN_x$:H), or another material that is susceptible to an etching process that preferentially removes the upper portion 210b of the film layer without affecting the unmodified portion 210a beneath.

Figure 4E:
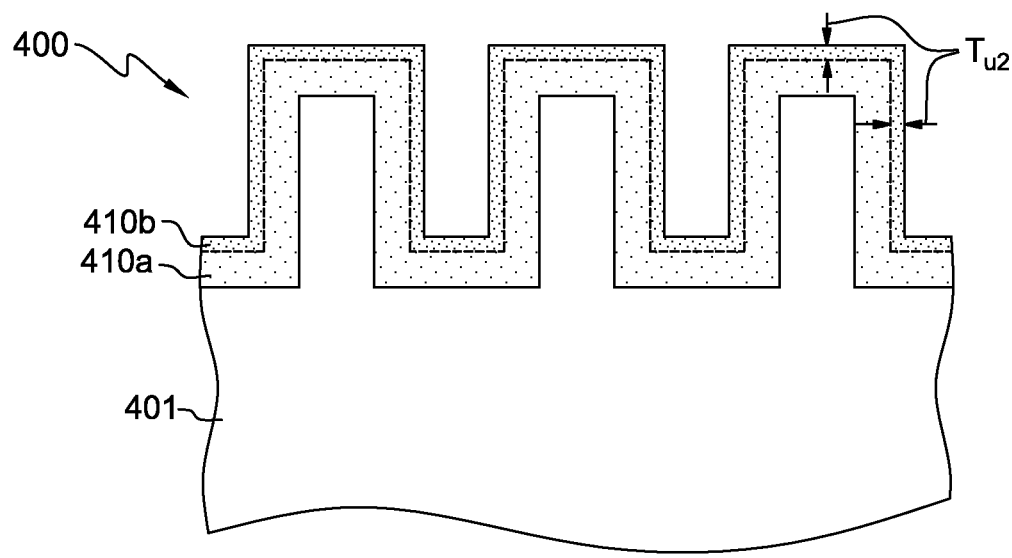

FIG. 4E depicts the structure 400 of FIG. 4E after further modification of the upper portion 410b of the film layer via a second implantation has been completed, the portion beneath this upper portion 410a remaining unmodified. The upper portion 410b now has a thickness $T_{u2}$. As described in previous embodiments, thickness $T_{u2}$ may, for instance, be uniform, as depicted here for illustrative purposes; alternatively the thickness $T_{u2}$ may vary between some regions of structure 400. As also described in one or more previous embodiments, the implanting of a single species element or molecule into a dielectric film layer, either by PAI or GCIB, may alter the film layer's molecular structure in the region of the implant, and may result in an increase in the thickness of the film layer. For example, this increase may occur within the upper portion 410b of the film layer that undergoes modification of the etch property, affecting the thickness $T_{u2}$ of the upper portion. The exact increase in thickness $T_{u2}$ will depend on the type of film layer, the at least one species element or molecule implanted into the upper portion of the film layer, the energy of implantation, and the angle of implantation, etc. This increased thickness $T_{u2}$ may need to be accounted for during one or more subsequent etching processes to etch away a correct amount of the upper portion of the film layer to achieve a desired critical thickness for the film layer.

Figure 4F:
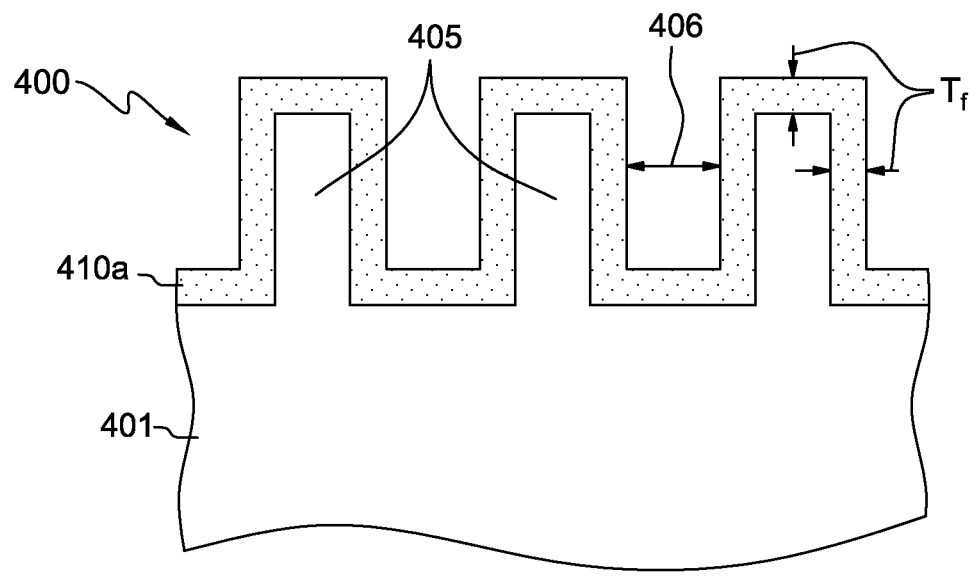

FIG. 4F depicts the structure 400 of FIG. 4E after the second etching process has reduced the thickness of the upper portion of the film layer. In one or more example embodiments, where the second implantation process included, in one example, pre-amorphization ion implantation of oxygen or, in another example, GCIB implantation of $O_2$, into the modified upper portion of the film layer, the second etching process may be, for instance, an etching process that preferentially removes oxides, such as a SICONI® cleaning process. The unmodified portion 410a of the film layer remains with final resulting thickness $T_f$. In the example embodiment depicted in FIG. 4F, the etching process has removed the entire upper portion of the film layer, leaving only that portion 410a of the film layer that remained unmodified by the implantation process. It is to be understood, however, that the etching process may reduce the thickness of the upper portion of the film layer without entirely removing it. The final thickness $T_f$ of resulting film layer 410a is shown in this figure, by way of example, as being uniform, though it is to be understood that thickness $T_f$ may also be non-uniform, if desired. In any one or more of the above embodiments, the reduction of the upper portion of the film layer may be used to achieve one or more target critical dimensions for the film layer. The critical dimensions may be, for instance, the reduced thickness $T_f$ of the film layer, the spacing 406 between non-planar regions 405 of structure 400, or a different critical dimension of structure 400.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

What is claimed is:

1. A method comprising:
facilitating fabricating a circuit structure, the facilitating comprising:
providing a circuit structure having a film layer thereover, the film layer being non-metal and disposed over planar and non-planar areas of the circuit structure, the film layer having a non-amorphous crystalline lattice structure;
modifying an etch property of an upper portion of an entirety of the film layer, the modifying comprising implanting at least one species of element or molecule into the upper portion of the film layer, wherein the etch property of the film layer remains unmodified beneath the upper portion thereof, and wherein the modifying further comprises controlling the implanting to prevent amorphization of the non-amorphous crystalline lattice structure of the film layer including the upper portion thereof; and
subjecting the structure comprising the film layer with the modified etch property to at least one etching process, wherein the modified etch property of the upper portion of the film layer facilitates fabrication of the circuit structure using, in part, the etching process, and wherein the modified etch property of the upper portion of the film layer prevents removal of a lower portion of the film layer by the at least one etching process.

2. The method of claim 1, wherein modifying the etch property of the upper portion of the film layer comprises making the upper portion of the film layer preferentially susceptible to the etching process.

3. The method of claim 2, wherein the implanting at least one species of element or molecule comprises pre-amorphization ion implantation of at least one of oxygen, boron, phosphorous, arsenic, or germanium, and wherein the controlling the implanting to prevent damage to amorphization of the non-amorphous crystalline lattice structure of the film layer including the upper portion thereof comprises maintaining an energy of the ion implantation at or below 15 keV.

4. The method of claim 2, wherein the implanting at least one species of element or molecule comprises pre-amorphization ion implantating implanting the upper portion of the film layer to form an oxide layer, and wherein the etching process preferentially removes oxides.

5. The method of claim 2, wherein the implanting at least one species of element or molecule comprises gas-cluster ion beam implantation of at least one of O2, SiH4+O2, SiH4+NH3, B2H6, PH3, SiH4+PH3, Si, or SiH4+He, and wherein the controlling the implanting to prevent damage to amorphization of the non-amorphous crystalline lattice structure of the film layer including the upper portion thereof comprises maintaining an energy of the gas-cluster ion beam at or below 15 keV.

6. The method of claim 2, wherein the subjecting further comprises controlling the etching process to etch the upper portion of the film layer from the film layer, leaving the film layer with a reduced thickness, the reduced thickness achieving a desired critical dimension for the film layer.

7. The method of claim 2, wherein the etching process is a first etching process, and wherein the subjecting further comprises subjecting the structure comprising the film layer with the modified etch property to a second etching process, the first etching process removing a first fractional part of the upper portion of the film layer with the modified etch property, and the second etching process removing a second fractional part of the upper portion of the film layer with the modified etch property.

8. The method of claim 1, wherein modifying the etch property of the upper portion of the film layer comprises making the film layer preferentially resistant to the etching process.

9. The method of claim 8, wherein the implanting at least one species of element or molecule comprises pre-amorphization ion implantation of at least one of amorphous silicon, carbon, nitrogen, argon, or xenon, and wherein the controlling the implanting to prevent amorphization of the non-amorphous crystalline lattice structure of the film layer including the upper portion thereof comprises maintaining an energy of the ion implantation at or below 15 keV.

10. The method of claim 8, wherein the implanting at least one species of element or molecule comprises gas-cluster ion beam implantation of at least one of argon, xenon, krypton, silicon, SiH4+CH4, SiH4+CHF3, SiH4+N2+CH4, and SiH4+NH3, and wherein the controlling the implanting to prevent amorphization of the non-amorphous crystalline lattice structure of the film layer including the upper portion thereof comprises maintaining an energy of the gas-cluster ion beam at or below 15 keV.

11. The method of claim 8, wherein the implanting at least one species of element or molecule increases a thickness T of the film layer, and facilitates achieving a desired critical dimension of the film layer.

12. The method of claim 8, wherein the etching process is a first etching process, and wherein the subjecting further comprises subjecting the structure comprising the film layer with the modified etch property to a second etching process, the first etching process being an etch process to which the upper portion of the film layer with the modified etch property is resistant, and the second etching process reducing a thickness T of the film layer.

13. The method of claim 12, wherein reducing the thickness T of the film layer facilitates achieving a desired critical dimension of the film layer.

14. The method of claim 1, wherein the implanting comprises a first implanting of at least one first species of element or molecule into the upper portion of the film layer, and the etching process is a first etching process, wherein the modified etch property of the upper portion of the film layer facilitates fabrication of the circuit structure using, in part, the first etching process, and wherein the facilitating fabrication further comprises:
further modifying the modified etch property of the upper portion of the film layer, the further modifying comprising a second implanting of at least one second species of element or molecule into the upper portion of the film layer, resulting in a further modified etch property of the film layer in the upper portion thereof, wherein the etch property of the film layer remains unmodified beneath the upper portion, and wherein the further modifying further comprises controlling the second implanting to prevent amorphization of the non-amorphous crystalline lattice structure of the film layer including the upper portion thereof; and
further subjecting the structure comprising the film layer with the further modified etch property to a second etching process, wherein the further modified etch property of the upper portion of the film layer facilitates fabrication of the circuit structure using, in part, the second etching process.

15. The method of claim 14, wherein the modifying of the etch property of the upper portion of the film layer comprises making the upper portion of the film layer preferentially resistant to the first etching process, and wherein the further modifying of the modified etch property of the upper portion of the film layer comprises making the upper portion of the film layer preferentially susceptible to the second etching process.

16. The method of claim 15, wherein the modifying comprises at least one of: pre-amorphization ion implantation of at least one of carbon, nitrogen, amorphous silicon, xenon, or argon; or, gas-cluster ion beam implantation of at least one of argon, xenon, krypton, silicon, SiH4+CH4, SiH4+CHF3, SiH4+N2+CH4, and SiH4+NH3.

17. The method of claim 15, wherein the further modifying comprises at least one of: pre-amorphization ion implantation of at least one of oxygen, boron, phosphorous, arsenic, or germanium; or, gas-cluster ion beam implantation of at least one of O2, SiH4+O2, SiH4+NH3, B2H6, PH3, SiH4+PH3, Si, or SiH4+He.

18. The method of claim 15, wherein the further subjecting further comprises controlling the second etching process to etch the further modified upper portion of the film layer from the film layer, leaving the film layer with a reduced thickness, the reduced thickness achieving a desired critical dimension for the film layer.

19. The method of claim 14, wherein the modifying of the etch property of the upper portion of the film layer comprises making the upper portion of the film layer preferentially susceptible to the first etching process, and wherein the further modifying of the modified etch property of the upper portion of the film layer comprises making the upper portion of the film layer preferentially resistant to the second etching process.

20. The method of claim 19, wherein the subjecting further comprises controlling the first etching process to etch the upper portion of the film layer from the film layer, leaving the film layer with a reduced intermediate thickness, and wherein the second implanting of at least one species of element or molecule increases a final thickness of the film layer, and facilitates achieving a desired critical dimension for the film layer.

* * * * *